(12) United States Patent
Kozhaya et al.

(10) Patent No.: US 8,863,066 B1
(45) Date of Patent: Oct. 14, 2014

(54) WIRING-OPTIMAL METHOD TO ROUTE HIGH PERFORMANCE CLOCK NETS SATISFYING ELECTRICAL AND RELIABILITY CONSTRAINTS

(71) Applicant: International Business Machines Corporation, Armonk, NY (US)

(72) Inventors: Joseph N. Kozhaya, Morrisville, NC (US); Phillip J. Restle, Katonah, NY (US); David Wen-Hao Shan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/894,453

(22) Filed: May 15, 2013

(51) Int. Cl.
G06F 17/50 (2006.01)

(52) U.S. Cl.
CPC .................................. *G06F 17/5077* (2013.01)
USPC .......................................................... 716/126

(58) Field of Classification Search
USPC .......................................................... 716/126
See application file for complete search history.

(56) References Cited

U.S. PATENT DOCUMENTS

| | | | |
|---|---|---|---|
| 6,308,302 B1 | 10/2001 | Hathaway et al. | |
| 7,721,245 B2 | 5/2010 | Maziasz et al. | |
| 8,332,805 B1 | 12/2012 | Birch et al. | |
| 2006/0006918 A1* | 1/2006 | Saint-Laurent | 327/295 |
| 2007/0106969 A1* | 5/2007 | Birch et al. | 716/6 |
| 2010/0005218 A1* | 1/2010 | Gower et al. | 711/5 |
| 2010/0005220 A1* | 1/2010 | Loughner et al. | 711/5 |
| 2011/0260318 A1* | 10/2011 | Eisenstadt | 257/737 |

* cited by examiner

*Primary Examiner* — Thuan Do
*Assistant Examiner* — Mohammed Alam
(74) *Attorney, Agent, or Firm* — Keivan Razavi; H. Daniel Schnurmann

(57) ABSTRACT

High performance clock distributions and similar wiring networks require improvements in reliability and performance. This is especially true when hierarchical wiring with different metal thicknesses is employed and when a smaller number of large, higher-power buffers are used to reduce timing variability. Routing of critical nets improves robustness, reliability, and resistance while minimizing track and power usage. The method further optimizes the use of multiple physical pins on buffers to achieve desired electrical criteria. This involves optimal selection of additional routing beyond what is needed to satisfy simple connectivity. The routing involves an iterative process to select and evaluate additional possible routes on multiple layers. Each iteration involves extraction and simulation or estimation, and additional routes are added until the desired electrical criteria are met.

20 Claims, 6 Drawing Sheets

WIRING-OPTIMAL METHOD TO ROUTE HIGH PERFORMANCE CLOCK NETS SATISFYING ELECTRICAL AND RELIABILITY CONSTRAINTS

FIELD OF THE INVENTION

The present invention relates to the field of electronic design automation and more specifically, to a method for routing high performance clock nets and other critical high-load nets in a wiring optimal manner while satisfying electrical and reliability constraints.

BACKGROUND

Conventional methods are generally limited to work only for the case where metal layer of driving buffer output pin shapes is immediately adjacent to the metal layer on which routing is to occur. Routing problems are exacerbated by the use of hierarchical wiring where the lower metal layers are finer pitch and thinner, and the upper wiring levels are thicker with a coarser pitch. For various reasons, buffer pins are often on lower, thinner wiring levels, where each wire is more resistive and carries less current reliably. More robust wiring methods are thus required to reliably route from lower thinner layers to the upper thicker layers when hierarchical wiring is used. Other related problems include the need to use fewer, larger, buffers to avoid a large variability that occurs when large numbers of small buffers are used in contrast with larger buffers that drive more loads.

FIG. 1 shows a system block diagram of a prior art computer system 100 that includes a central processing unit 110, a system memory 120, an input/output (I/O) controller 130, a network interface 140, and multiple interface units such as keyboard 150, monitor 160 and mass storage 170. The central processing unit 110 communicates with system memory 120, I/O controller 130 and other interface units via bus 180. The computer system 100 is shown having additional or fewer subsystems such as multiple processing units, external speaker device or a disk storage.

FIG. 2 illustrates a method for routing one or multiple low performance clock nets as known in the prior art. Referring to FIG. 2, a clock net 200 is illustrated with a driving buffer 210 and receiving buffer(s) 220. The driving buffer 210 is shown having multiple physical output pin shapes 230 on some metal layer (e.g., M9) and a physical input pin shape 240 on some metal layer (e.g., M5). One of the output pin shapes 230 is connected through path segment(s) 250 to the clock net routing 260 on some pair of metal layers (e.g., M10, M11) which in turn connect to the input pin shape(s) 240 of the receiving buffer(s) 220 through path segments 270, creating connections from the pair of routing metal layers (e.g., M10, M11) to the metal layer of the input pin shape (e.g., M5). The aforementioned solution can result in reliability violations when applied to high performance clock nets because the current carrying capability of the metal wires that constitute path segment(s) 250 are limited. Furthermore, path segment(s) 250 can introduce a high effective resistance resulting in large wire delays that violate wire delay limits for high performance applications.

FIG. 3 illustrates a method of routing one or multiple high performance clock nets as known in the prior art. The same clock net 200 is shown in FIG. 2 with a major difference being the description of a robust pin structure 380 on one of the routing metal layers (e.g., M10) which is connected to the output pin shapes 230 on some other metal layer (e.g. M9) of the driving buffer 210 with multiple parallel path segments 350 that interconnect the two adjacent metal layers (e.g., M9 and M10) using extended wire segments on M9 and vias to M10. Such a method requires that all the physical pin shapes of the output pin 230 of the driving buffer 210 be wired to the robust pin structure 380 that causes local wiring congestion and an increase of the power consumption of the integrated circuit. Furthermore, existing methods only work for the case where the metal layer of the output pin shapes (M9) and the metal layer of the robust pin structure(s) (M10) are adjacent layers that can be connected to each other using only one level vias.

In view of the aforementioned reasons, it is desirable to route high performance clock nets and other critical high-load nets in a wiring optimal manner while satisfying the electrical and reliability constraints to achieve reliability, performance and power-efficiency goals applicable to the high-performance chip designs.

BRIEF DESCRIPTION OF THE DRAWINGS

Embodiments of the present invention will be understood and appreciated more fully from the following detailed description of the invention, taken in conjunction with the accompanying drawings of which.

SUMMARY OF THE INVENTION

Figure 1:
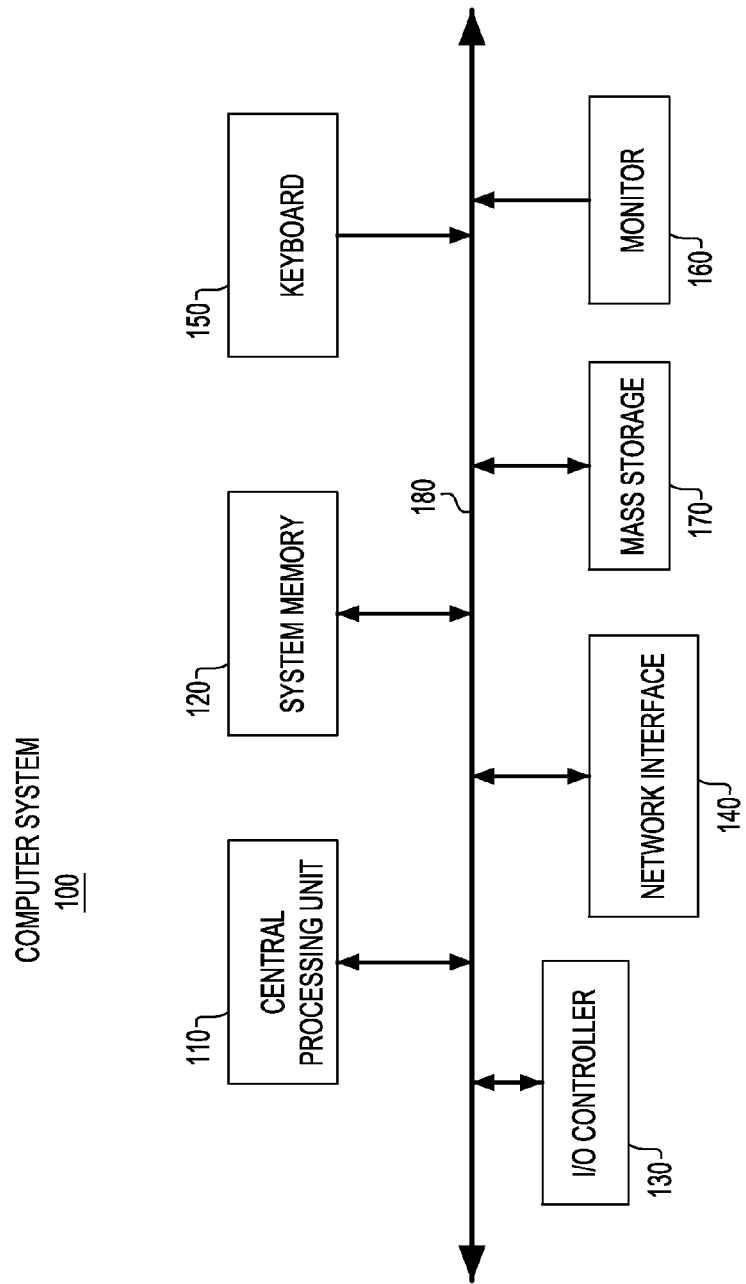
FIG. 1 is a block diagram illustrating an example of a prior art computer processing system.
Figure 2:
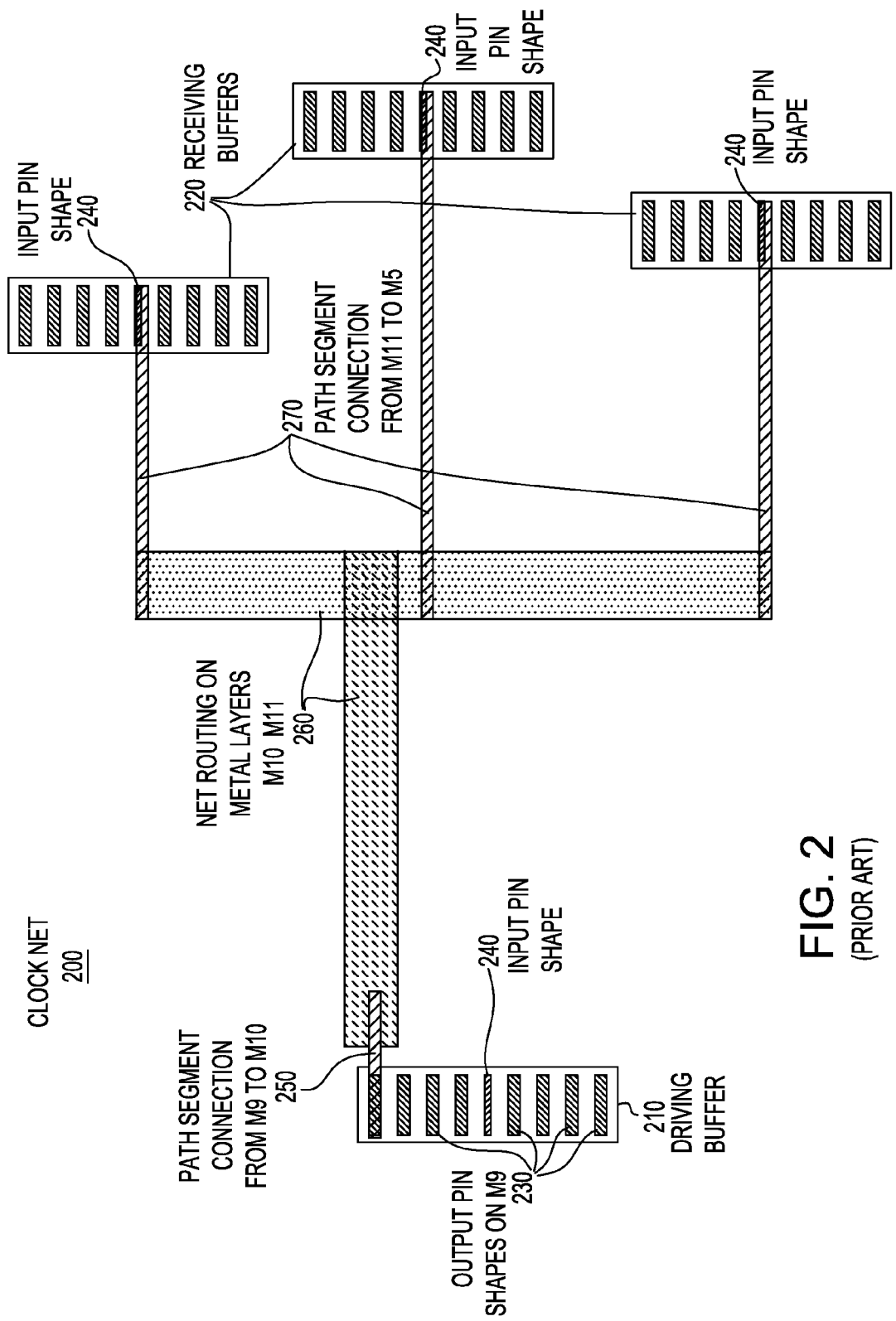
FIG. 2 is a description of a method for routing one or multiple low performance clock nets as known in the prior art.
Figure 3:
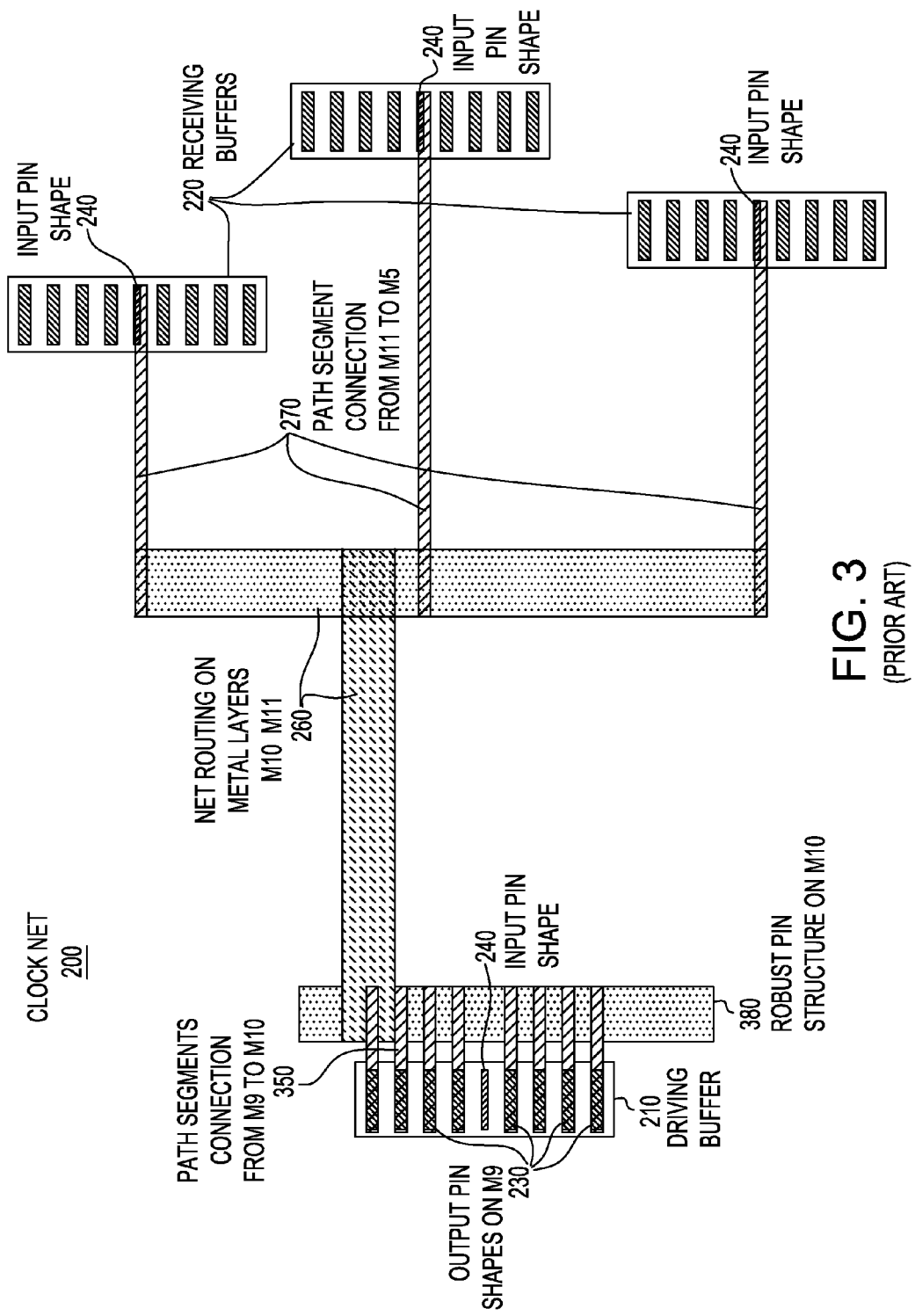
FIG. 3 is a description of method for routing one or multiple high performance clock nets as known in the prior art.

In one aspect of the invention, in one embodiment, a wiring-optimal method for routing high performance clock nets in an integrated circuit includes creating one or multiple robust pin structures as wire segments on one or multiple metal layers to be used for routing to the receiving buffer(s), using a minimum-length general router that connects all the output pin shapes of a driving clock buffer to the robust pin structure(s).

In another embodiment, the method includes creating wires on multiple metal layers connecting receiving buffer(s), running an extraction tool to create a model of all relevant metal wires and driving and receiving buffer(s) parasitics, and computing electrical and reliability metrics including electrical currents through wire segments, effective resistance and delay of the wiring using electrical simulation or other modeling approximations.

In still another aspect, in an embodiment, the method includes comparing computed electrical and reliability metrics to predetermined limits and objectives based on performance requirements of the application, and identifying violations. Then, based on the results, more wiring connections are added between the driving buffer(s) output pin shapes and the robust pin structure(s) enabling the removal of identified violations, and still achieving required objectives.

In yet another aspect, in an embodiment, the method includes executing one or multiple iterations between extracting the wiring network, computing the electrical and reliability metrics of interest, and adding additional wiring connections between the driving buffer(s) output pin shapes and the robust pin structures(s) until all the electrical and reliability metrics such as electrical current limits and effective wire delay are satisfied.

In still a further aspect, in one embodiment, the method uses an electrical evaluation based iterative process to route N connections from robust pin shape(s) to the cell pin physical shapes until all the electrical metrics of interest such as signal delay, signal slew, and reliability limits on electrical currents, are honored. s until all electrical metrics of interest such as delay, reliability limits (electromigration, Irms), and skew are honored. The detailed placement of the N connections can be determined using a bounding box defined by the smallest rectangle that encloses the robust pin shapes and all the cell pin physical shapes. The N connections can be placed within this bounding box, and as close to the center of the bounding box as possible. Then, robust pin shape(s) are created on the required metal layer, starting with a minimum length general router to provide connectivity to all the pins. The evaluated electrical metrics (extraction and simulation) based on estimated loads (from placement or propagated data) report any violations of the electrical metrics. If no violations exist, the method comes to an end. If violations still remain, additional routes from the robust pin structure to the pin shapes are introduced. The method then iterates repeating the electrical evaluation process and routing added connections as needed until all the electrical requirements are met.

In yet a further aspect, an embodiment includes a non-transitory storage medium for storing a wiring-optimal routing solution for high performance clock nets in an integrated circuit, readable by a processing circuit storing instructions for executing by way of a processing circuit for performing a method that includes: creating one or more robust output pin structure(s) including multiple wire segments on one or more metal layer(s); using the wire segments for routing to one or more receiving buffer(s) of the nets; and adding wiring connections between the output pin shapes of the driving buffers of the nets and one or more robust output pin structure(s) determined by requirements of electrical and reliability metrics.

Additional advantages are realized through the techniques of embodiments of the present invention where the final resulting wiring solution is guaranteed to satisfy all the electrical and reliability metrics. Furthermore, the method creates optimal wiring results by adding wires only when the previous wiring does not satisfy all the electrical and/or reliability violations to minimize unnecessary wiring track and power usage. Furthermore, in one embodiment, the method provides a practical physical interface for balanced routing where a manual or automated balanced routing solution focuses on routing to the robust pin structure(s) without the challenge of connecting to the buffer output pin shapes in a reliable manner.

DETAILED DESCRIPTION

Other embodiments and aspects of the invention are described in detail hereinafter and are considered as part of the claimed invention. For a better understanding of the embodiments as well as the features and advantages thereof, refer to the description of the drawings. In accordance with exemplary embodiments of the disclosure, a method is provided for creating a wiring-optimal routing solution for high performance clock nets that satisfy all the electrical and reliability metrics.

Clock signal distributions, clock grids and clock trees for high performance processors and application specific integrated circuits (ASIC) designs consisting of multiple buffered levels of high performance clock nets to be routed in a controlled manner to satisfy electrical and reliability constraints. Each clock net can be driven by one or by a plurality of clock buffers (or inverters)—being referred hereinafter as driving buffer(s)—. Each clock net can drive one or a plurality of clock buffers (or inverters), referred hereinafter as receiving buffer(s). Routing a clock net can involve adding wires on a plurality of metal layers connecting to the output pin(s) of the driving buffer(s) and the input pin(s) of receiving buffer(s). In the case of a high performance design, each clock buffer can be designed with an output pin structure consisting of multiple physical shapes on a given metal layer, such that it can reliably drive a range of loads, where the total load represents the parasitic capacitance of the wiring connecting the driving and receiving buffer(s) as well as the parasitic input capacitance(s) of the receiving buffer(s).

Certain automated solutions for routing clock nets in lower performance applications can create metal wires connected to only one of the physical shapes of the output pin of the driving buffer. The physical shape can be selected based on what is deemed easiest to achieve access to an automated routing tool. This solution, when applied to routing clock nets in the high performance applications, can result in violations of both electrical and reliability constraints. High performance designs can require high frequency clock distribution networks. Furthermore, high frequencies reduce the total load that can be driven by each buffer and by each physical output pin without violating electromigration and local-heating current limits. Furthermore, routing to only one physical shape can result in a larger resistance of the resulting wiring network. Any such increase in wiring resistance can result in delay or signal quality violations in the high-performance networks.

As described previously, the method can use an electrical evaluation based on an iterative process to route N connections from robust pin shape(s) to cell pin physical shapes until all the electrical metrics of interest such as signal delay, signal slew, and reliability limits on electrical currents, are honored. (Note: a signal slew refers to the time required for a signal waveform to make a transition from a low-voltage value to a high voltage value). Reliability limits on the currents in wires can include a maximum average current (IDC) value for each wire. Limiting IDC currents reduces electromigration (EM) that is found to be a reliability problem, since it can cause electrical opens in the wires, or shorts between the wires, resulting in chip failure. Furthermore, other reliability limits can be determined by way of the maximum of the Root-Mean-Square of the electrical current (IRMS). Limiting the IRMS in each wire also limits the local heating caused by high currents. Local heating can reduce chip reliability by accelerating the EM. In addition, reliability can limit the wire currents, imposing reliability limits on the driving and receiving circuits. Circuit reliability limits are generally defined in terms of the capacitance driven by a buffer, or a power limit for a buffer.

For higher performance applications including processors and high performance ASICS, a solution for routing clocks consists of connecting to all the physical shapes of an output pin of the driving buffer. Wiring is created by extending all the pin physical shapes in one direction, e.g., left or right for a pin with physical shapes on a horizontal metal layer; or up or down for a pin with physical shapes on a vertical metal layer. The total EM current limit in such a case is defined by the sum of EM current limits for each output pin physical shape. The effective resistance of the wiring structure is reduced, as is the wire delay, particularly since there are multiple connections to the multiple physical shapes of the output pin of the driving buffer(s), in contrast with the prior art where connecting to all the output pin physical shapes independent of the actual load that is driven can be far from being optimal. This can be caused by unnecessary additional wiring that creates local wiring congestion and increased power consumption. In addition, even when wiring applies to all physical shapes, the EM reliability limits can still be violated with conventional solutions because they only connect to the pin shapes in one direction, as previously described.

Figure 4:
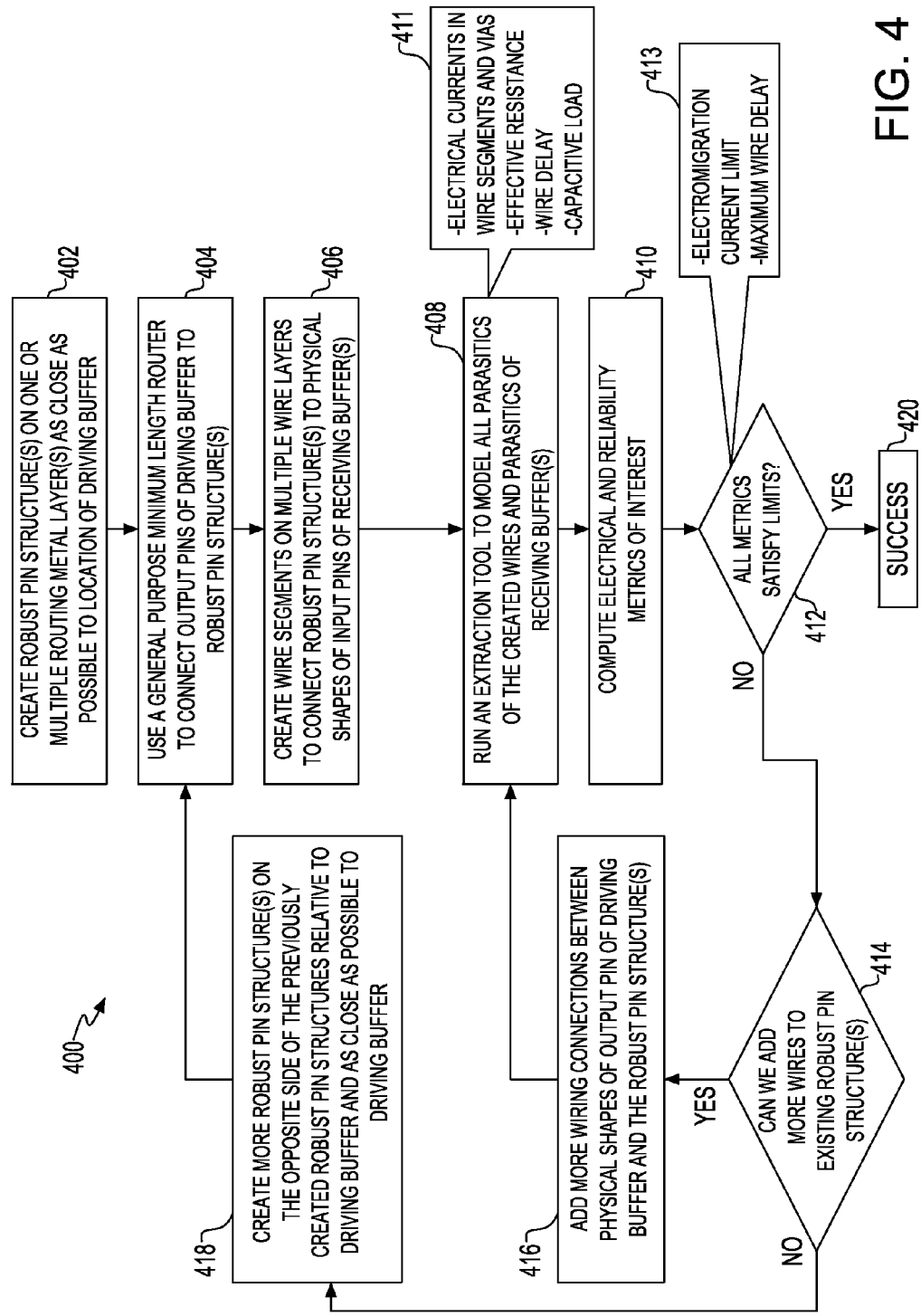
FIG. 4 illustrates a flow diagram of a method for routing one or multiple high performance clock nets in an integrated circuit according to an exemplary embodiment of the invention.

FIG. 4 illustrates a flow diagram of a wiring-optimal method 400 for routing high performance clock net(s) while satisfying electrical and reliability constraints. As shown in block 402, method 400 begins by creating robust pin structure(s) on one or multiple metal layers that can be employed for routing the clock net as close as possible to the location of the driving buffer. Next, referring to block 404, the method 400 may use a general purpose minimum-length router to connect all the output pin shapes of the driving buffer to the created robust pin structure(s). Block 406 shows method 400 including creating wire segments on multiple metal layers to connect to the input pins of the receiving buffer(s).

Next, method 400 is shown running an extraction tool to model the parasitics of the wire segments as well as the receiving buffer(s) as illustrated at block 408. Parameter extraction methods calculate circuit parameters, e.g., resistance and capacitance from physical parameters, such as wire widths, wire lengths, distances to other wires, and dielectric constants. (Note: The extracted circuit parameters are generally employed for circuit simulation to obtain device and wire currents, voltages, and other important electrical parameters). While accurate parameter extraction and circuit simulation can be accurate, generally they can take a long time. Accordingly, a variety of approximation techniques referred to as model approximations can be used, and designed to speed up the extraction and simulation process without sacrificing the required accuracy. In certain cases, earlier in the design process, some circuit parameters cannot be extracted because the physical placement and detailed characteristics of some wires and circuits are not yet decided. In such a case, it is often necessary to estimate parameters such as capacitance loading, to allow a robust design to be completed albeit the incomplete information).

Next, referring to block 410, electrical and reliability metrics of interest are computed (e.g., by running a simulation tool). Illustrative examples of electrical and reliability metrics can include electrical currents in wire segments, effective resistance of the wiring, wire delay from the driving buffer to the receiving buffer(s), and total capacitive load of the clock net as shown at block 411.

Next, at decision block 412, method 400 determines whether all the electrical and reliability limits are satisfied. Block 413 describes examples of reliability and electrical limits such as electromigration current limit that can be supported by metal wires of a specific width at given environmental conditions (temperature, voltage, power-on hours) and the maximum allowed wire delay based on performance specification of the application. If no violations exist, method 400 concludes with success at block 420. Otherwise, method 400 determines whether more wiring connections can be made to existing robust pin structure(s), as shown in decision block 414.

If it is possible to provide added wiring connections, method 400 provides more wiring connections between the physical shapes of the output pin of the driving buffer and the already created robust pin structures, as illustrated in block 416, followed by method 400 returning to block 408. If it is not possible to additional wiring connections, method 400 can create more robust pin structure(s) on the opposite side of the previously created robust pin structures relative to the driving buffer, and as close as possible to the driving buffer as illustrated in block 418. Then method 400 returns to block 404.

In summary, method 400 includes multiple iterations between the different steps starting from block 404 or block 408 of the flow diagram until all the electrical and reliability metrics have been satisfied, at which instance method 400 concludes with 'success' at block 420.

Figure 5:
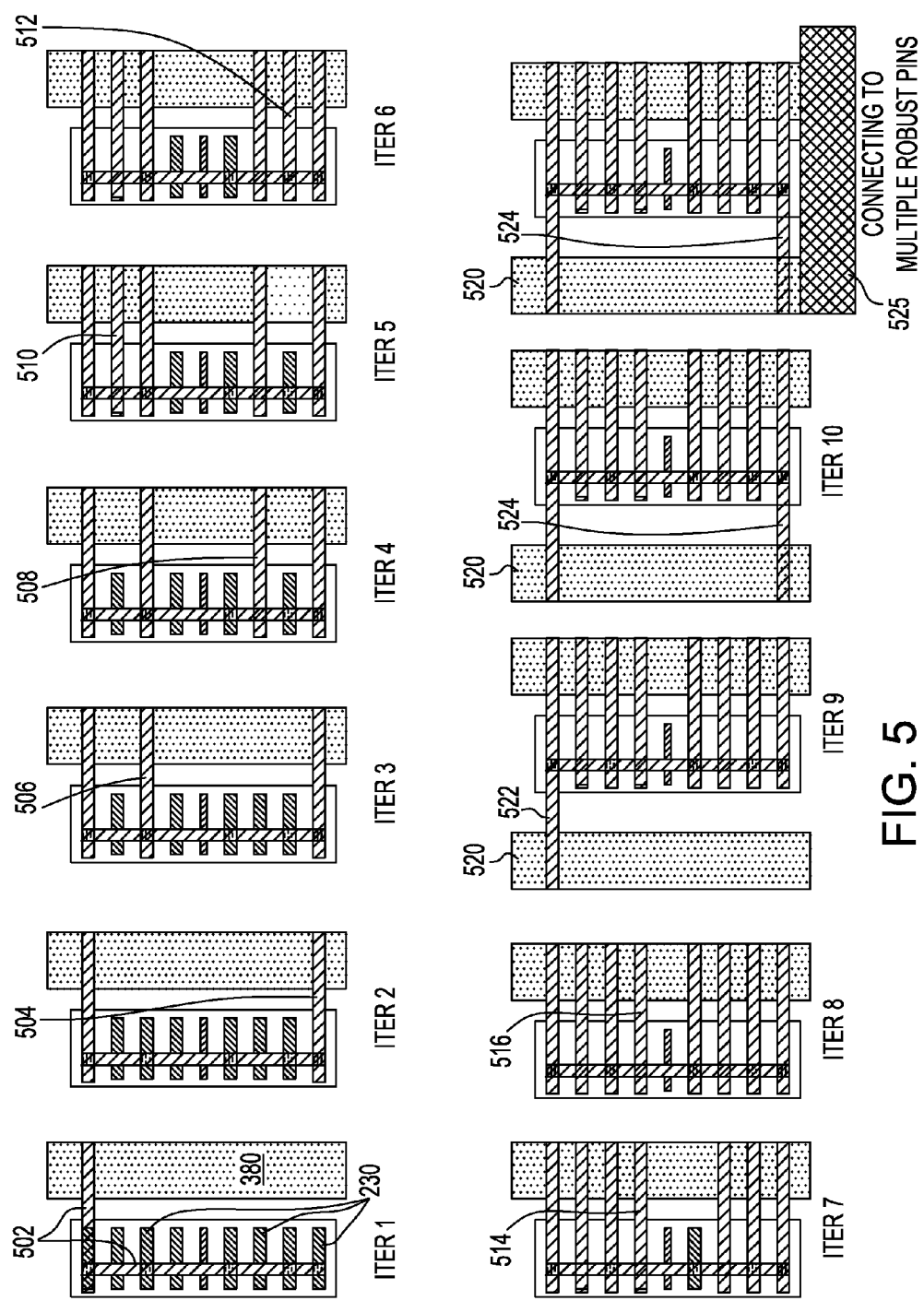
FIG. 5 is an illustration of the wiring at different iterations for routing one or multiple high performance clock nets according to an embodiment of the present invention.

FIG. 5 illustrates the wiring connections between the physical shapes of the output pin of the driving buffer and the robust pin structure(s) at different iterations through the flow, according to an embodiment of the invention.

According to FIG. 5, iteration (ITER) 1 drawing shows the wiring connections 502 between the physical shapes 230 of the output pin of the driving buffer and the robust pin structure(s) 380 following the first iteration. Next, ITER 2 drawing illustrates how the method can involve by adding additional wiring connections 504 between physical shapes 230 of output pin of the driving buffer and the robust pin structure(s). FIG. 5 drawing further illustrates the wiring connections resulting after each of several iterations through an embodiment where ITER 3 drawing shows added wiring connection 506. Similarly, ITER 4 drawing shows added wiring connection 508; ITER 5 drawing shows added wiring connection 510; ITER 6 drawing shows added wiring connection 512; ITER 7 drawing shows added wiring connection 514; and ITER 8 shows added wiring connection 516. After ITER 8, there are no more open wiring tracks to add wiring connections between the physical shapes of the output pin of the driving buffer and the existing robust pin structures. The method can include creating new robust pin structures 520 on an opposite side of the existing robust pin structure relative to the driving buffer and adding wiring connection 522 from the physical shapes of the output pin of the driving buffer to the new robust pin structure(s) 520, as illustrated in ITER 9 drawing. The method terminates in ITER 10 drawing showing added wiring 524 connecting the output pin shapes added robust pin structure(s). When two or more robust pins are required as illustrated in ITER 9 and ITER 10 drawings, it may be necessary that the wiring routes connect to all robust pin shapes, such as depicted on wire 525 in a final drawing referenced as 'Connecting to Multiple Robust Pins'. Wiring 525 effectively reduces the current in each wire, and reduces the effective resistance. The method concludes with success since all electrical and reliability metrics are found to be satisfied.

Figure 6:
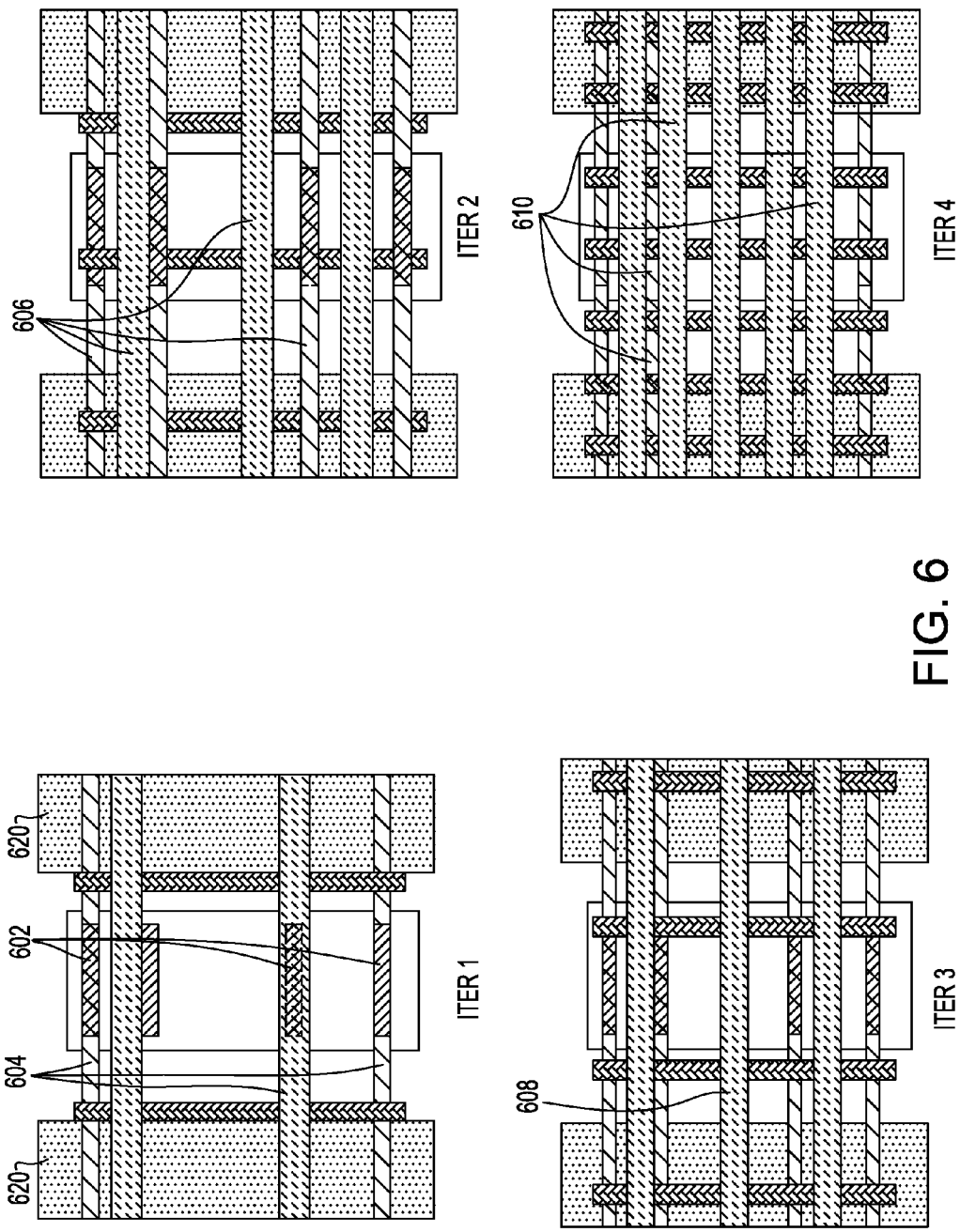
FIG. 6 illustrates the wiring at different iterations for routing one or multiple high performance clock nets according to an embodiment of the invention.

FIG. 6 illustrates the wiring connections between the physical shapes of the output pin of the driving buffer and the robust pin structure(s) according to an embodiment of the disclosure. According to FIG. 6, the drawing labeled ITER 1 shows how the method creates the initial wiring mesh 604 to connect the physical shapes 602 of the output pin of the driving buffer to the mesh of robust pin structure(s) 620. ITER 2 shows a finer mesh created by adding more parallel wiring connections 606 between the outputs pin physical shapes and the robust pin structure(s).

Still referring to FIG. 6 the resulting mesh in ITER 3 drawing is illustrated with added mesh wires 608. The method concludes at ITER 4 drawing which shows the fine mesh with added wires 610 required to meet all the reliability and electrical constraints. Creating a local mesh of wiring between the physical shapes of the output pin of the driving buffer and the robust pin structure(s) proves to be useful in distributing the high currents required to drive the capacitive load at the specified performance parameters to reduce currents in the wire segments as well as wire delays through the wire segments.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of routing nets in an integrated circuit comprising:
   creating, by a computer, at least one robust output pin structure comprising multiple wire segments on one or more metal layers;
   using said multiple wire segments for routing to one or more receiving buffers of said nets; and
   adding wiring connections between output pin shapes of one or more driving buffers of said nets and said at least one robust output pin structure determined by requirements of electrical and reliability metrics, said robust output pin structure located between said one or more driving buffers and said one or more receiving buffers, wherein said at least one robust output pin structure is placed substantially adjacent to said output pin shapes of said one or more driving buffers for adding said wiring connections iteratively based on satisfying said electrical and reliability metrics.

2. The method of claim 1 further comprising creating at least one robust input pin structure comprising said multiple wire segments on said one or more metal layers.

3. The method of claim 1 wherein said nets to be routed comprise high performance clock nets connecting one or more driving clock buffers to one or more receiving buffers.

4. The method of claim 1 wherein said creating said routing based on electrical current is obtained from parameter extraction and simulation, or by way of model approximations.

5. The method of claim 1 further comprising defining a bounding box by a physical location of said output pin shapes of each of said driving buffers and receiving buffers and creating said robust pin structure on at least one metal layer in a physical location closest to a geometric center of said bounding box.

6. The method of claim 1 wherein evaluating said electrical and reliability metrics are based on estimated capacitance loads wherein actual capacitances are still unknown.

7. The method of claim 1 wherein said electrical metrics comprise signal delay, signal slew, and signal skew.

8. The method of claim 1 wherein said reliability metrics comprise reliability limits on electric currents.

9. The method of claim 6 further comprising iteratively repeating said electrical evaluation and said routing additional wiring connections until said electrical and reliability requirements are met.

10. The method of claim 9, wherein said iterative repeating electrical evaluation concludes when said electrical and reliability metrics change by less than a predetermined threshold.

11. The method of claim 1, wherein said routing said design routing nets is achieved when a single route or an available route are determined to be inadequate.

12. The method of claim 1 wherein at least two robust pin structures are created on opposed sides of said driving buffers and said output pin shapes of said driving buffers extend in opposite directions to be connected to said two or more robust pin structures.

13. A method of routing nets in an integrated circuit comprising:
    defining, by a computer, a physical region around each driving buffer of said nets;
    creating a robust pin structure as a local mesh of wires on two or more metal layers in said physical region, said each driving buffer being located substantially adjacent to said created robust pin structure;
    connecting said local mesh of wires to output pin shapes of said driving buffers;
    using said local mesh of wires to route input pin shapes of one or more receiving buffers, said robust pin structure created between said each driving buffer and said one or more receiving buffers;
    and
    adding or subtracting wires from said local mesh of wires coupled between said robust pin structure and said each driving buffer iteratively to meet requirements of one or more electrical and reliability metrics associated with said nets.

14. The method of claim 13 wherein said routed nets are high performance clock nets connected to one or more driving clock buffers to one or more of said receiving buffers.

15. The method of claim 13 wherein said local mesh is based on an estimated capacitive load.

16. The method of claim 13 further comprising iteratively repeating an electrical evaluation and increasing wire density in said local mesh until said electrical and reliability requirements are met.

17. The method of claim 16, wherein said iterative electrical evaluation is completed when said electrical and reliability metrics change by less than a predetermined threshold.

18. The method of claim 16 further comprising creating a model consisting of circuit parameters for relevant metal wires and circuit parameters for driving buffers and receiving buffers including reliability limits on buffer current and buffer power.

19. The method of claim 17 wherein said electrical and reliability metrics comprise electrical currents through said wire segments, effective resistance and delay of said wiring segments, computed using electrical simulation or model approximation.

20. A non-transitory storage medium for storing a wiring-optimal routing solution for high performance clock nets in an integrated circuit, readable by a processing circuit storing instructions for executing by the processing circuit for performing a method comprising:
    creating at least one robust output pin structure comprising multiple wire segments on one or more metal layers;
    using said wire segments for routing to one or more receiving buffers of said nets; and
    adding wiring connections between output pin shapes of one or more driving buffers of said nets and said at least one robust output pin structure determined by requirements of electrical and reliability metrics, said robust output pin structure located between said one or more driving buffers and said one or more receiving buffers, wherein said at least one robust output pin structure is placed substantially adjacent to said output pin shapes of said one or more driving buffers for adding said wiring connections iteratively based on satisfying said electrical and reliability metrics.

\* \* \* \* \*